United States Patent [19]
Redmyer

[11] Patent Number: 6,064,192
[45] Date of Patent: May 16, 2000

[54] REVENUE METER WITH INTEGRAL CURRENT TRANSFORMER

[75] Inventor: John D. Redmyer, Galloway, Ohio

[73] Assignee: Ohio Semitronics, Hilliard, Ohio

[21] Appl. No.: 09/056,959

[22] Filed: Apr. 8, 1998

[51] Int. Cl.$^7$ .......................... G01R 21/00; H01F 27/26
[52] U.S. Cl. ................. 324/127; 324/117 R; 324/117 H
[58] Field of Search .................... 324/126, 127, 324/114, 117 R, 117 H

[56] References Cited

U.S. PATENT DOCUMENTS

| | | | |
|---|---|---|---|
| 3,573,616 | 4/1971 | Kahen | 324/117 |
| 3,621,392 | 11/1971 | Liebermann et al. | 324/142 |
| 3,984,798 | 10/1976 | Bussen | 324/127 X |
| 4,059,798 | 11/1977 | Dierker et al. | 324/127 |
| 4,283,677 | 8/1981 | Niwa | 324/127 |
| 4,384,289 | 5/1983 | Stillwell et al. | 324/126 X |
| 4,542,354 | 9/1985 | Robinton et al. | 332/11 D |
| 4,573,037 | 2/1986 | Robinton et al. | 340/347 NT |
| 4,688,234 | 8/1987 | Robinton | 375/10 |
| 4,709,375 | 11/1987 | Robinton et al. | 375/27 |
| 4,847,780 | 7/1989 | Gilker et al. | 324/127 X |
| 4,851,803 | 7/1989 | Hahn | 324/127 X |
| 5,426,360 | 6/1995 | Maraio et al. | 324/126 |

*Primary Examiner*—Glenn W. Brown
*Attorney, Agent, or Firm*—James R. Eley, Esq.; Kegler, Brown Hill & Ritter

[57] ABSTRACT

An integral meter and current transformer to measure single phase active and reactive energy, voltage and frequency in industrial, commercial and multi-family residential applications. The meter CT is the primary sensing element in a revenue metering system encompassing multiple meter CTs serially connected in groups in communication with data cores for collection and reporting of energy consumption. Numerous data cores may be networked to report to a central station which may be remotely interrogated over the network or dial up modem connection. The meter CT utilizes a split-core transformer with substantially overlapping fingers. Disengaging split-core sections of the meter CT enables it to be easily installed around a loaded conductor without the interruption of power to the load.

11 Claims, 4 Drawing Sheets

REVENUE METER WITH INTEGRAL CURRENT TRANSFORMER

BACKGROUND OF THE INVENTION

This invention generally relates to an apparatus and method for the measurement of electrical energy consumption for revenue metering and various other applications.

In the past electronic kilowatt-hour meters used in revenue metering were discrete instruments that utilized a current transformer ("CT") with the meter to which it was connected being typically installed on the wall in a utility room. Wiring had to be installed between the meter and the measurement point. CTs, used to inductively sense the amount of current flowing through a loaded conductor, were installed in or near an adjacent electrical box thus requiring additional external wiring.

A CT used in revenue metering applications typically comprises a one-piece toroidal coil, usually referred to as a "doughnut", which is mounted around a loaded conductor to be measured. Since the doughnut style CT does not come apart, in order to install it around a wire, the wire had to be disconnected so that it could be installed through the hole in the doughnut. Connecting a wire then, required that the electrical power had to be interrupted for the period of time while installation was taking place. In some applications this is a major problem, especially where uninterruptable loads, such as computers and alarm systems are involved. Additionally, such an interruption can be very costly especially where a lot of users are affected by the installation.

Split-core type current transformers have been available for some time and are not novel in and of themselves. Such a design enables split sections of a CT to be temporarily disengaged to allow a loaded conductor to be surrounded by the CT when it is re-engaged. This is manifested in pincher-type pickups which are typically used in connection with hand-held ammeters. Inexpensive split-core CT designs generally employ core halves which merely butt together when engaged. At most, there was minimal overlap between split-core portions. As a result, the split-core CT's in the prior art are not accurate enough for revenue metering since the inductive coupling of the split-core CT design tended to be much more inaccurate than their doughnut-style counterpart.

Additionally 3-phase meters basically required 3 single-phase meters to be integrated into one 3-phase meter. That meant a lot of models of dedicated meters had to be developed to meet all of the various applications, such as 3-phase, 3-element meters, 3-phase, 2-element meters, 1-phase, 1-element and 1-phase, 2-element meters for various power applications. This required discrete and separate designs.

What was needed was an accurate, split-core current transformer that could be easily and inexpensively installed. Additionally, it was desirable to have a compact CT with an integrated meter which could be combined in multiple-phase metering applications and which did not require a lot of extraneous wiring.

SUMMARY

An advantage of the meter CT is to measure single-phase active energy (kilowatt-hours), reactive energy (kilovar-hours), voltage and frequency in industrial, commercial and multifamily residential applications. It is the primary sensing element for a larger system encompassing many meter CTs in groups of up to 30 reporting to a single data core. Additionally, many data cores may be networked to a central station which may, in turn, be remotely interrogated over a network, phone modem connection or directly observed by an operator.

The present invention solves the problems of inaccuracy associated with a split-core CT in revenue metering applications and that associated with excess wiring by moving the metering that used to be externally wired on a wall down into the same electrical box as the CT. One advantage of the invention is that it not only integrates the meter into the current transformer for easy and cost-effective installation, it also separates the sensing elements of the meter into universally adaptable metering components. In this respect a 2-element metering application can use 2 meter CT's without requiring a dedicated 2-element design, a 3-element meter would use 3 meter CT's and so on. Thus, from a manufacturing standpoint, only a single style, universal meter CT product needs to be produced which can be combined to meet a variety of power metering applications.

To overcome the accuracy problem suffered by previous split-core designs, the present invention utilizes a substantial interleaving of the CT's split-core portions. This arrangement has been demonstrated to greatly improve the accuracy over previous split-core designs. Thus the invention achieves the advantages associated with a split-core CT design without sacrificing accuracy. One embodiment of the present invention has been shown to be accurate enough for revenue metering meeting standards established by the American National Standards Institute ("ANSI") for domestic meters, and Measurement Canada, for Canadian metering applications.

One advantage of the invention is that it provides for an electrical meter connectable to a mains voltage for computing the amount of energy being consumed by a load being powered by the mains voltage, comprising a separable housing and a split-core type current transformer within the housing for inductively sensing current in a conductor connected to the load. The transformer comprises a core of laminated metal having first and second sections, oppositely disposed, each of the first and second sections being surrounded by wound coils. A removable assembly comprising third and fourth sections forms an opposite side of the core and extend as plurality of fingers therefrom. These third and fourth sections are configured to be substantially the same length as the first and second sections and are slidably engagable with the first and second sections to mate forming a rectangular core having a central opening. The coils provide an output signal proportional to an amount of current flowing through the conductor located within the opening. Processing circuitry is located within the housing and is responsive to the output from the coils and the mains voltage for computing the amount of energy being consumed by a load connected to the conductor. Once computed, the meter provides an electrical output which corresponds to the amount of energy consumed or the voltage or frequency of the monitored voltage connected to the meter CT. Signal treatment circuitry is interposed between the mains voltage and the processing circuitry.

Another advantage of one embodiment of the invention is the integration of the meter and the CT into a single, easily installable package.

Another advantage of one embodiment of the invention is the serial communications circuitry that permits the meter CT to be daisy-chained with other meter CT's (currently 30) and tied into a single "data core", or concentrator for monitoring energy consumption being metered by the individual meter CTs. Presently, up to 30 meter CTs can be grouped into individual "virtual" meters, i.e., one meter CT could form one, single-phase meter and three meter CT's could be grouped into one, three-phase meter. Thus 30 meter CTs could form ten, 3-phase virtual meters or 30, single-phase virtual meters or any variation thereof Other objects and advantages of the invention will become apparent to those skilled in the art upon reading the following detailed description and upon reference to the included drawings.

DETAILED DESCRIPTION

Figure 1:
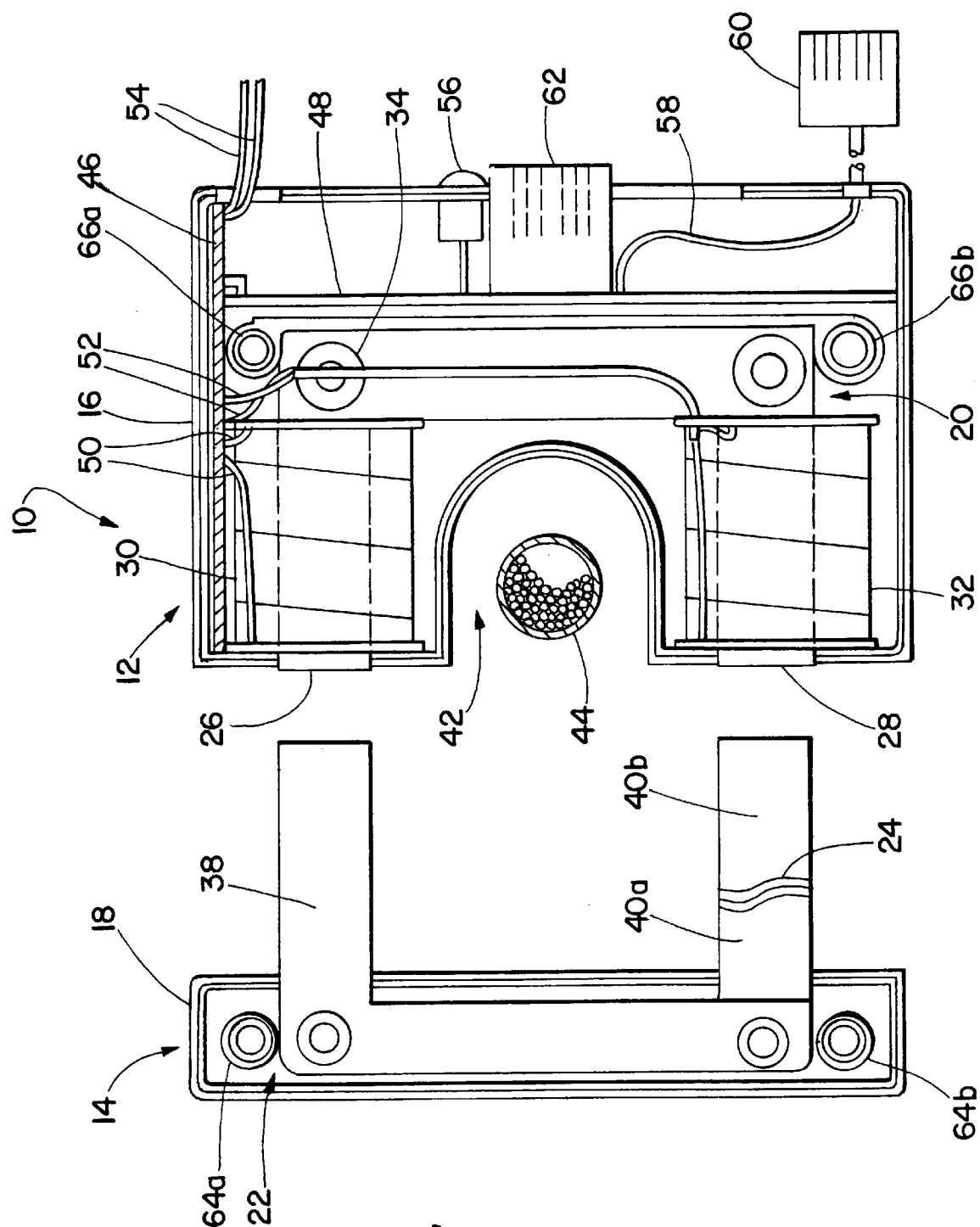
FIG. 1 is a plan view of the end cap and base portions of a meter CT according to the present invention.

Referring first to FIG. 1, an embodiment of the meter CT 10 of the present invention is there shown generally at 10. The meter CT 10 is shown having two sections, a base section 12 and an end cap section 14. Base housing shell and end cap housing shell 16 and 18 respectively, retain first and second split-core portions 20 and 22, metering printed circuit board 46 and main printed circuit board 48. Housings 16 and 18 are preferably fabricated from Norell® plastic (Norell is a trademark of General Electric, Inc.) or its equivalent due to its durability and thermal characteristics. However, other plastics, such as ABS or others, may be utilized without substantially affecting the operation of the invention.

First split-core portion 20 is comprised of first and second current transformer ("CT") sections 26 and 28, mounted in parallel to one another. The sections are shown to be joined together with rivets, as at 34, although other fastening methods may be employed. The first and second CT sections 26 and 28 are typically fabricated from overlapping, L-shaped laminated steel sections, as depicted in partial cutaway at 24. First and second wound coils 30 and 32 encompass first and second CT sections 26 and 28 respectively. The purpose of coils 30 and 32 is to respond to current flowing through a conductor under load, as depicted at 44, by causing an induced current to flow through first and second wire pairs 50 and 52 respectively to metering p.c. board 46.

Second split-core portion 22 is comprised of third and fourth CT sections 38, 40a and 40b, which extend in the form of matable fingers. Finger 38 and fingers 40a and 40b are substantially the same length as first and second CT sections 26 and 28 and are sized to be slidably mated with them to form a rectangular CT with a central opening 42 when the two split-core portions 20 and 22 are fully engaged with one another. The split core portion 22 and its corresponding fingers 38, 40a and 40b are preferably fabricated from overlapping, ell-shaped laminated steel sections, as well. Both the meter CT base section 12 and its mating end cap section 14 are depicted in FIG. 1 without their respective cover plates (not shown). However, in use, the first and second split-core portions 20 and 22 would be fitted with cover plates as a safety precaution and to protect the meter CT 10 contents from environmental elements.

Extending from metering p.c. board 46 are mains wires 54. These two wires, generally a white and black one, connected at points W5 and W6 on the metering p.c. board 46, are also connected across the electrical mains voltage 53 to provide the board with a voltage reference. See FIG. 2. Electrically interconnected to metering p.c. board 46 is main p.c. board 48. Extending therefrom and through the side of the base housing shell 16 is multi-colored L.E.D. 56 which is provided to give a visual indication as to whether the meter CT 10 has been installed with the proper polarity. The cover plate (not shown) of the meter CT 10 is provided with a visually perceivable dot (not shown) so that the meter CT may be installed in the proper orientation. The dot is designed to be installed facing the supply side of the line, however additional conventions could function equally as well to serve the same purpose.

Also extending from main p.c. board 48 and through the side of the base housing shell 16 is communications cable 58. Cable 58 is terminated with a connector 60, which is preferably of a modular-type such as an RJ-45. Communications cable 58 sends metered information from the meter CT 10 to a remote data core 70 or to yet another meter CT 10. A modular receptacle 62, is daisy-chained communicating therewith, the mate to modular connector 60, is provided for daisy-chaining a series of meter CTs 10 together. Presently, thirty meter CTs 10 may be serially joined in this manner to communicate.

The end cap section 14 of the meter CT 10 may be fixed into place with meter CT base section 12. Through holes 64a, 64b, 66a and 66b are provided on meter CT sections 12 and 14 enabling sealing ties or their equivalent to be employed to keep an assembled meter CT 10 from being separated. Additionally, a sensing element, such as a magnet (not shown) may be added to automatically sense whether the two meter CT sections 12 and 14 are connected. Thus, if the end cap section 14 of the split-core meter CT 10 was removed, a change in the magnetic field would be sensed which would generate a signal that the CT was disconnected or tampered with, where the signal would be reported to the data core 70 by taking appropriate actions. This could be such as reporting an alarm condition or otherwise signaling suitable personnel that an attempt was being made to compromise the integrity of the meter CT 10.

Figure 2:
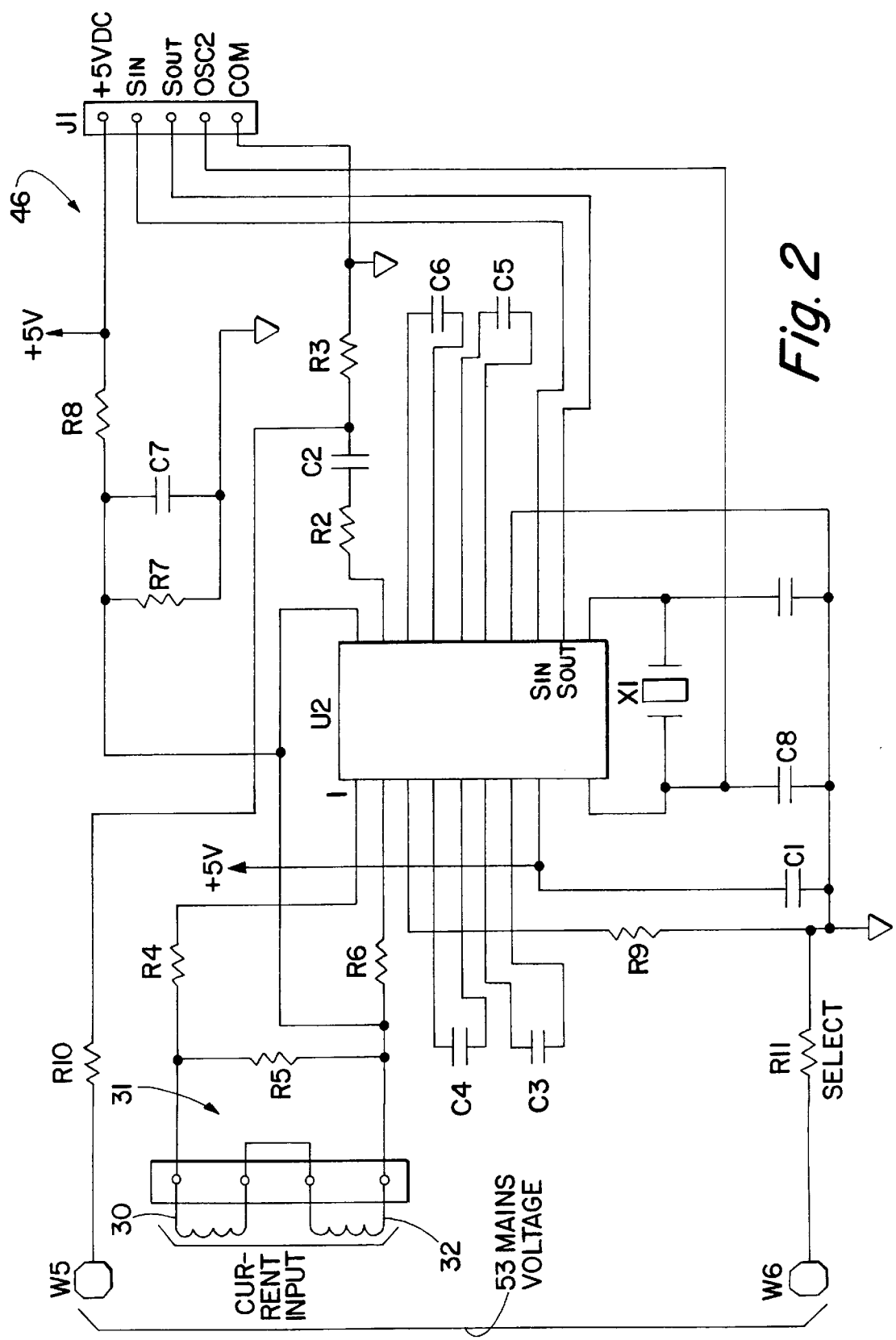
FIG. 2 is an electrical schematic of the metering circuitry according to the present invention.

Referring next to FIG. 2, a schematic of the circuitry of the metering p.c. board 46 is there depicted. This board accepts a scaled signal for voltage and a scaled signal from the current transformer 31 for current and multiplies them together to produce a pulse output corresponding to watt-hours. Mains voltage 53 points at W5 and W 6 is provided to metering chip U2 via "select" resistors R10 and R11 whose values are chosen to scale the voltage input and which may be varied depending upon the maximum mains voltage 53. Various ranges may be selected, depending upon the maximum system voltage, nominally 150 $V_{ac}$, 300 $V_{ac}$ and 600 $V_{ac}$. The meter CT 10 can also be adapted to accommodate various currents as well, such as 100 amps, 200 amps and 400 amps merely by properly selecting the value of resistor R5.

Metering chip U2 performs bi-directional active and reactive power/energy and frequency measurements based upon sensed current through the split-core current transformer 31 and the mains voltage 53 supplied via mains wires 54 to input points W5 and W6. Preferably, metering chip U2 is provided as a commercially available part such as a model number SA9103C manufactured by SAMES.

The metering chip U2 is a CMOS mixed signal A/D integrated circuit which performs power/energy calculations across a power range of 1000:1 to an overall accuracy of better than Class 1. The metering chip U2 includes all the required functions for 1-phase power and energy measurement, such as two oversampling A/D converters for the voltage and current sensed inputs via W5 and W6 and current transformer 31, respectively, power calculations and energy integration. The metering chip U2 integrates the measured active and reactive power consumption into 22 bit integers, which are accessible via line out on the on-chip serial port. 5 Alternatively, metering chip U2 may be selected to provide a pulse rate output, the frequency of which is proportional to the power consumption being measured. Such a metering chip is available as a Model SA9602E from SAMES. When this model of the chip is employed, energy consumption may then determined by integrating the power measurement over time.

In the circuit shown in FIG. 2, capacitors C4 and C6 are the outer loop capacitors for the two integrated oversampling A/D converters. The values chosen for capacitors C4 and C6 determine signal-to-noise ratio and stability performance and are preferably sized at around 560 picofarads. C3 and C5 are the inner loop capacitors of the A/D converters. The preferred value for capacitors C3 and C5 for the SAMES metering chip U2 is around 0.0033 picofarads.

Resistors R4, R6 and R5 define the current level into the current sense input of metering chip U2 in the present embodiment. The values selected should provide an input current of 16 microamps into the metering chip U2 at rated line current. Resistors RIO and R2 set the current for the mains voltage 53 sense input. The values should be selected so that the input current into the voltage sense input (virtual ground) is set to around 14 microamps. Resistor R9 defines all on-chip bias and reference currents. The optimum value for R9 for the SAMES metering chip U2 is around 24 kilohms. Crystal X1 is a color burst TV crystal running at 3.5795 MHz for the oscillator (pins 10 and 11) on the metering chip U2. The oscillator frequency is divided down to 1.7897 MHz on-chip to supply timing signals for the A/D converters and digital circuitry.

The active and reactive energy and measured per count by metering chip U2 may be calculated by applying the following formula:

Energy per count=V*I/K watts seconds
Where V=equals rated voltage
I=rated current
K=9281 for active energy
K=4640 for reactive energy The mains voltage frequency may be calculated by the metering chip U2 as follows:

Frequency=crystal frequency/register value * 8

The metering chip U2 is provided with an on-chip serial interface for reading and resetting of the chip's on-chip integrators. The serial interface is accessed via $S_{in}$ and $S_{out}$ (pins 13 and 12) which are provided, in turn, to main p.c. board 48 via jumper J1. In addition to computing active and reactive energy, metering chip U2 can also monitor and consult mains voltage 53 line frequency, as well. Line frequency may be an important parameter, especially in those countries where the power is not well regulated.

Figure 3:
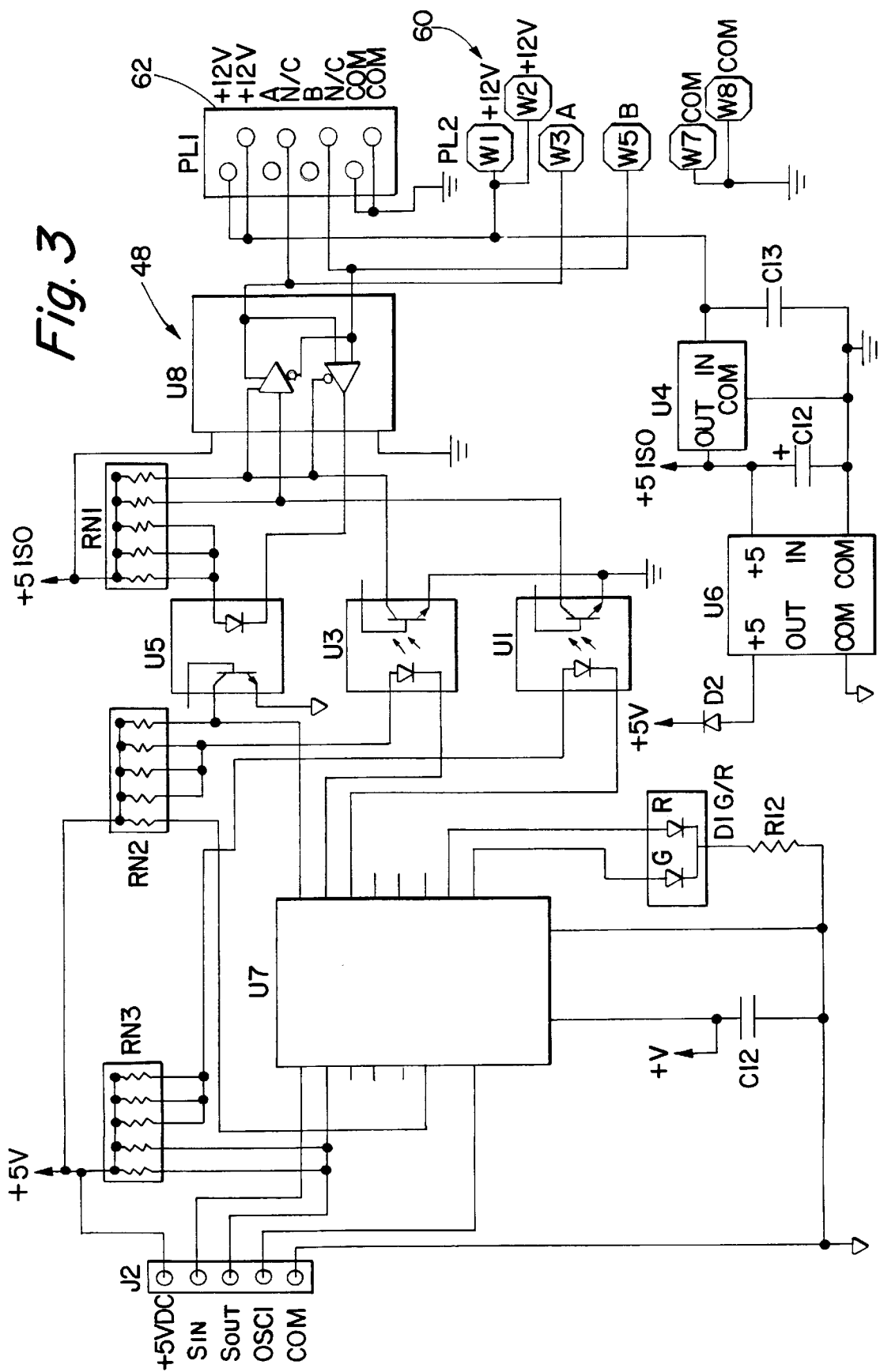
FIG. 3 is an electrical schematic of the control, communications and signal treatment circuitry according to the present invention.
Figure 4:
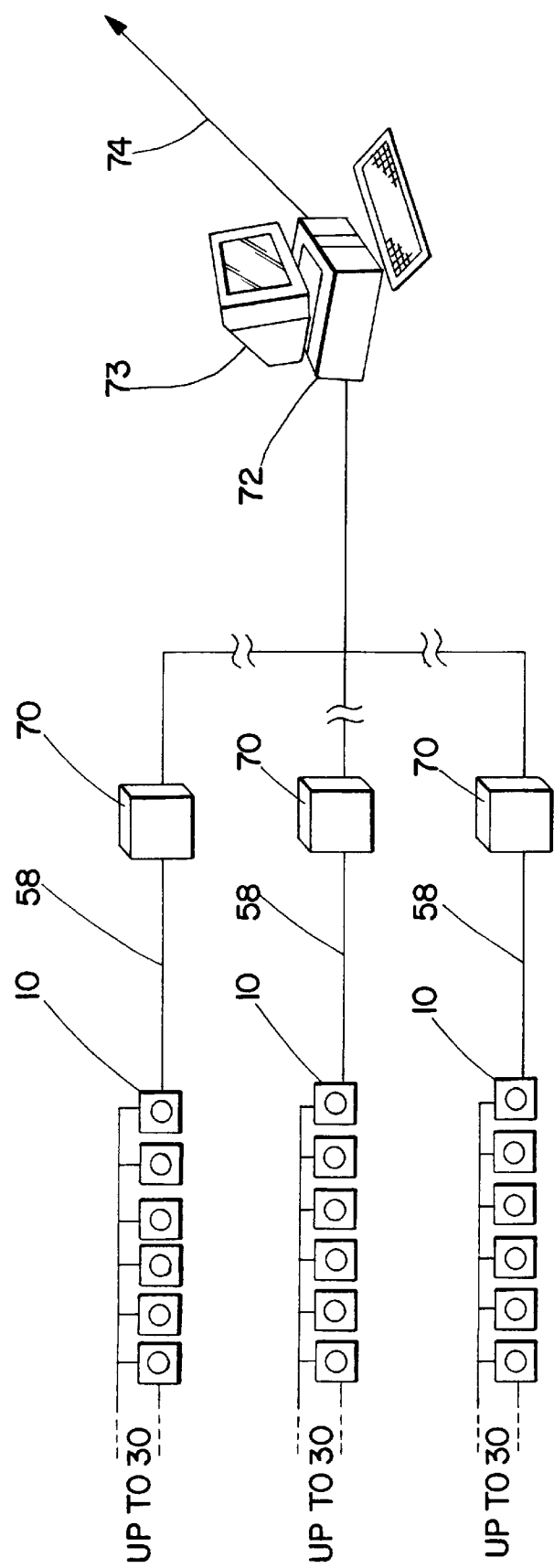
FIG. 4 is block diagram showing the interconnection of meter CTs in a network of data cores according to the present invention.

Referring next to FIG. 3, the main p.c. board 48 is therein depicted. Metering p.c. board 46 and main p.c. board 48 are joined by jumpers J1 and J2 and can be seen to be mounted at 90 degrees to one another with said base housing shell 16. Boards 46 and 48 communicate serially. Jumper J2 is connected to microcontroller U7, commercially available as a model PIC16C84 from MicroChip Technologies, Inc.

Microcontroller U7 is an 8-bit, CMOS $E^2PROM$ employing RISC (reduced instruction set) architecture. This model of microcontroller provides a total of 35 instructions. The primary function of microcontroller U7 is to read the information computed by the metering chip U2 and then convert, calibrate, display and transmit the corresponding data. The microcontroller U7 communicates through opto-isolators U1, U3 and U5, such as a model H11A1, from Quality Technologies to a serial communication port at PL2 which is, in turn, connected to an external data terminal or data core 70 and to supply data readings to the data core upon request. The microcontroller chip U7 also generates an output pulse which is used for factory calibration and for field accuracy testing.

Employment of microcontroller U7 in this configuration is somewhat unique in that connections to the mains voltage 53 via points W5 and W6 are provided to the microcontroller U7 through resistors R10 and R11. Since the meter CT 10 has no transformer to galvantically isolate its output from the mains voltage 53 to which it is connected to, isolation is needed to avoid circulating current that can burn out other instrumentation which may be connected to the output of the meter CT. This isolation is accomplished via photocouplers U1, U3 and U5. In addition to adding safety, isolation also enables 2-element metering applications on 3-phase power, thus opening up new metering opportunities for suppliers.

Another feature of the meter CT 10 is that microcontroller chip U7, has non-volatile memory in addition to flash memory (for programming) which permits the meter CT to store a calibration signal in response to a measured source of a precision voltage and current of a known wattage. A calibration constant is then serially downloaded from the data core 70 through modular plug PL2 60 which, in turn, is stored in the non-volatile memory of U7, enabling the meter CT 10 to be in perfect calibration. Once calibrated the CT meter 10 is given a one-write digital "lock" command after which time the meter can no longer be programmed. The primary advantage of this arrangement is that there are no mechanical adjustments necessary to calibrate the meter CT 10, thus it is relatively unaffected by vibration or wear. Once calibrated and locked, recalibration is not an option. Thus, this one-write calibration technique also renders the meter CT 10 extremely tamper-resistant.

The outputs of photocouplers U1, U3 and U5 are directed through transceiver U8 which converts the output levels to the standard voltage levels designated by RS-485 standards. Thus an output device connected to PL1 62 sees standard RS-485 differential signal level which in this case is −0.5 V to (Vcc +0.5 V). Transceiver U8 may be provided as a model 487CPA, low power, slew-rate-limited RS-485/RS-422 transceiver, available from Maxim Integrated Products. The low-slew-rate communication on the RS-485 bus is a binary protocol which is preferred in this application and other critical applications, such as control of traffic signals and airport lighting, where there is a low tolerance for error. The output of transceiver U8 is provided to an external device, such as a data core 70, via modular plug PL2 60.

Multi-colored LED D1 is connected to suitable output pins of microcontroller U7. Preferably the output of LED D1 alternates between green and red illuminations. In this regard a green output may be used by the microcontroller U7 to signify that the meter CT 10 has been installed with the proper polarity. Microcontroller U7 may also be programmed to cause LED D1 to flash when the meter CT 10 is sensing power/energy. If the meter is connected backwards, the LED D1 will be illuminated red by microcontroller U7. To indicate that meter CT 10 is measuring watt-hours, the LED D1 will blink proportionately, either green or red, depending upon whether the meter CT is hooked up with the proper polarity.

Operating voltage (d.c.) is supplied to the meter CT 10 in the form of +12 Vdc from the data core 70 via pins W1 and W2 of plug PL2. This voltage is used to power the RS-485 communication ports, PL1 and PL2 and is also stepped down, isolated and regulated to +5 $V_{dc}$ for the microcontroller chip U7 and the metering chip U2. This step down function is performed by a DC to DC converter U4. Regulation is accomplished via high isolation voltage regulator U6, as may be commercially supplied as a model HPR 400 by Power Convertibles. To conserve on space, voltage regulator U6 may be provided as a single-in-line package (SIP).

Referring additionally to FIG. 1, a nominally three foot (3') communications cable 58 is provided having an RJ-45-type modular plug 60 and is labeled generally in FIG. 3 as W1–W8. A mating RJ-45-type receptacle 62 is employed at PL1, enabling numerous meter CTs, as at 10, to be daisy-chained together by interconnecting the PL1 and PL2 components of respective meter CTs. The last meter CT in a daisy-chain is then connected to the external data concentrator or data core 70 via communication cable 58 and modular plug 60. It should be appreciated that in some applications other connectors or hard-wired arrangements may be preferable to the modular ones depicted herein.

The communications between the meter CT 10 and data core 20 is a binary protocol which is quite sophisticated and comprises a series of messages and responses to messages. Commands developed for the meter CT 10 follow below. During the manufacturing process communication takes place between the meter CT 10 and a calibration test stand (not shown). This is for testing and calibration. Once tested and calibrated, the meter CT 10 is given a "lock" command, and will no longer accept external calibration commands.

lations. Therefor, a "freeze and hold" command is provided which causes the meter CT 10 to take a reading and store it for later transfer to a requesting device, such as a data core 70.

All communications is accompanied by a check byte to make sure that all communications have been transmitted in a reliable manner. Using a check byte, the sender of data computes a value based upon the data being sent. The receiver, using the same algorithm, calculates a value based upon the data which was received. The two values are then compared to determine the integrity of the data. If the two values are identical, the receiver can have some assurances that the information received is the same as the information sent. Following is a complete listing of different commands. A calibration constant can be sent to the meter CT 10 and then the calibration constants may be read from meter CT. Each meter CT 10 is provided with a unique electronic serial number stored in non-volatile memory and that serial number can be read by data core 70 or other reading device.

Multiple data cores, as at 70, may be wired to communicate with a central p.c. 72 which may be interrogated over a network connection, modem line as at 74 or directly observed via a monitor 73.

Meters are referred to as "slaves" because they never originate a communication without a request from the "master" (data core 70). Slave meters are polled by the "master" (data core 70) using the protocol and commands herein defined. Slaves listen for approximately 120 mSec and are busy for approximately 40 mSec each internal read cycle of 160 mSec.

The Transport Protocol used by the meter CT 10 is a variation of HDLC master/slave messaging system.

Serial Communication Parameters: 9600 BAUD, 8 bit, no parity, 1 start bit, 1 stop bit Message Structure: All messages conform to the same general format, as follows.

| | |
|---|---|
| START CHARACTER | 7E HEX (126 DEC.) |
| DESTINATION ADDRESS | ADDRESS OF DEVICE INTENDED TO RECEIVE MESSAGE (00 TO FE HEX, 0 TO 254 DEC) 00 HEX IS RESERVED AS A BROADCAST (GLOBAL) ADDRESS, FF HEX IS THE MASTER ADDRESS |
| SOURCE ADDRESS | ADDRESS OF METER OR MASTER SENDING THE MESSAGE |
| FUNCTION CODE (2 BYTES) | COMMAND BYTE AND EXTENSION |
| [DATA] | OPTIONAL DATA FIELD OF 1 TO 3 BYTES. SOME COMMANDS CONTAIN DATA AS DEFINED BY THE FUNCTION CODE. |
| CHECK BYTE | A SINGLE BYTE CHECKSUM OF ALL MESSAGE BYTES BEGINNING WITH THE FIRST BYTE FOLLOWING THE START CHARACTER AND ENDING WITH THE BYTE PRECEDING THE CHECKSUM CHARACTER |
| STOP CHARACTER | 7E HEX (126 DEC) |

Following testing, that is during normal operations, communications is between the data core 70 and the meter CT 10. The communication does not require a data core 70, as a user may interface with a meter CT 10 with a personal computer, or other computing device, given the proper protocol interface.

The communications between the meter CT 10 and the data core 70 may be conducted at 9600 baud, with 8 bits, no parity, one start bit and one stop bit, although any number of communications speeds and protocols may be equally suited. There are provided, as disclosed below, a series of commands and responses to perform various functions and to store and retrieve watt-hour readings. In some applications it may be necessary to synchronize with other CT 10 meter readings, especially when conducting demand calcu- The start/stop character is intended to be a unique character, therefore, any such character naturally occurring in the message content is modified to maintain the uniqueness by simply implementing the following rules.

Any transmitted character which is not a START or STOP character is modified to prevent an unintended START/STOP character. The value is changed and an additional byte is added:

7E Hex replaced by 7D 01 Hex

7D Hex replaced by 7D 02 Hex

The receiving device will interpret received characters within the message by the same rules:

7D 01 Hex represents a true value of 7E Hex 7D 02 Hex represents a true value of 7D Hex Transport Character Modification is the last process before transmission and the first process of reception (after detection of a valid start character).

Meter CT Communication Functions

Function Code

| Hex CMD | Bytes EXT | Function | Action Taken |
|---|---|---|---|
| 45 | 01* | Read Exception Status | Communication response of meter status (error codes) |
| 46 | NN | Freeze Holding Registers | Command to meter(s) to update registers |
| 4C | 01 | Lock Meter | Prevents any future calibration changes to meter (calibration, Ser. No. & parameters |
| 4D | 01 | Read Meter Calibration | Communication response containing meter calibration value |
| 51 | 01 | Query Meter ID | Communication response of meter(s) identification parameters |
| 52 | 01 | Read Holding Watt-hour Register Values | Communication response of metered watt hour quantity |
| 54 | 01 | Begin Test Mode | Commands meter to output test pulses |
| 57 | 01 | (L) Write Meter Calibration | Writes calibration constant to the meter |
| 57 | 02 | Write Meter Address | Writes new address value into the meter |
| 57 | 03 | (L) Write Meter Ser. No. | 6 hex characters are written to the addressed meter |
| 57 | 04 | (L) Write Voltage Rating | Sets meter full scale voltage |
| 57 | 05 | (L) Write Current Rating | Sets meter full scale current |
| 58 | 01 | Exit Test Mode | Commands meter to exit test mode if active. The meter also exits Test Mode on loss of supply voltage, or receiving any bus communications with destination address of another meter. |

● (L) = Function disabled by Lock Meter Command
* Functions planned but not yet implemented.

COMMANDS AND RESPONSES
[45 01] READ EXCEPTION STATUS

HEX BYTE

| | |
|---|---|
| 7E | START CHARACTER |
| 01 | METER ADDRESS (DESTINATION) |
| FF | MASTER ADDRESS (SOURCE) |
| 45 | FUNCTION CODE |
| 01 | FUNCTION EXTENSION |
| XX | CHECK BYTE |
| 7E | STOP CHARACTER |

RESPONSE TO READ METER EXCEPTION STATUS [45 01]

HEX BYTE

| | |
|---|---|
| 7E | START CHARACTER |
| FF | DESTINATION ADDRESS IS MASTER |
| 01 | SOURCE ADDRESS OF METER RESPONDING |
| 45 | FUNCTION CODE (ECHO OF CMD RECEIVED) |
| 01 | COMMAND EXTENSION |
| 00 | DATA BYTE REG 1 HI |
| 00 | DATA BYTE REG 1 LO |
| XX | CHECK BYTE |
| 7E | STOP CHARACTER |

Each bit of data field corresponds to a possible error condition
00 HEX (no bits set) indicates no error conditions.

[46 NN] FREEZE HOLDING REGISTERS (BROADCAST ADDRESS)

HEX BYTE

| | |
|---|---|
| 7E | START |
| 00 | BROADCAST ADDRESS DESTINATION |
| FF | SOURCE ADDRESS IS MASTER |
| 46 | FUNCTION CODE IS A COMMAND FREEZE |
| 03 | FUNCTION EXTENSION USED AS A SEQUENCE NUMBER e.g., (03) |
| XX | CHECK BYTE |
| 7E | STOP CHARACTER |

The Command Extension byte is used as a sequence number for coordination of the freeze/read communications. The response to a read following a freeze command will include the last freeze sequence number executed. The master (Data Core) 70 can use this information to verify that a meter CT 10 is on the current read/freeze cycle. Multiple freeze commands are sent to insure a high probability of success on each freeze/read cycle. Meter CTs 10 will not execute a freeze command if it contains the same sequence number as the previously executed freeze.

RESPONSE TO FREEZE HOLDING REGISTERS [46 NN]-NONE [4C 01] LOCK METER

HEX BYTE

| | |
|---|---|
| 7E | START CHARACTER |
| FF | METER ADDRESS (DESTINATION) |
| 01 | MASTER ADDRESS (SOURCE) |
| 4C | FUNCTION CODE |
| 01 | FUNCTION EXTENSION |
| XX | CHECK BYTE |
| 7E | STOP CHARACTER |

RESPONSE TO LOCK METER [4C 01]-NONE [4D 01] READ METER CALIBRATION

HEX BYTE

| | |
|---|---|
| 7E | START CHARACTER |
| 01 | METER ADDRESS (DESTINATION) |
| FF | MASTER ADDRESS (SOURCE) |
| 4D | FUNCTION CODE |
| 01 | FUNCTION EXTENSION |
| XX | CHECK BYTE |
| 7E | STOP CHARACTER |

RESPONSE TO READ METER CALIBRATION [4D 01]

HEX BYTE

| | |
|---|---|
| 7E | START CHARACTER |
| FF | DESTINATION ADDRESS IS MASTER |
| 01 | SOURCE ADDRESS OF METER RESPONDING |
| 4D | FUNCTION CODE (ECHO OF CMD RECEIVED) |
| 01 | COMMAND EXTENSION |
| 09 | DATA BYTE 1 |
| FA | DATA BYTE 2 |
| XX | CHECK BYTE |
| 7E | STOP CHARACTER |

[51 01] QUERY METER ID

HEX BYTE

| | |
|---|---|
| 7E | START CHARACTER FROM MASTER |
| 01 | ADDRESS |
| FF | SOURCE ADDRESS |
| 51 | FUNCTION CODE |
| 01 | FUNCTION EXTENSION |
| XX | CHECK BYTE |
| 7E | STOP CHARACTER |

RESPONSE TO QUERY METER ID [51 01]

HEX BYTE

| | |
|---|---|
| 7E | START CHARACTER |
| FF | ADDRESS OF MASTER |
| 01 | ADDRESS OF METER |
| 51 | FUNCTION COMMAND (ECHO OF COMMAND RECEIVED) |
| 01 | FUNCTION EXTENSION |
| 12 | SN BYTE 1 |
| 34 | SN BYTE 2 |
| 56 | SN BYTE 3 |
| 00 | VOLT RTG, BYTE 1 |
| 78 | VOLT RTG, BYTE 2 |
| 00 | AMP RTG, BYTE 1 |
| 64 | AMP RTG, BYTE 2 |
| 01 | METER TYPE |
| 65 | FIRMWARE VER 101(65HEX) |
| XX | CHECK BYTE |
| 7E | STOP CHARACTER |

[52 01] READ HOLDING REGISTERS Master Read Command to specific address

HEX BYTE

| | |
|---|---|
| 7E | START CHARACTER |
| 01 | ADDRESS OF METER TO READ |
| FF | SOURCE ADDRESS IS MASTER |
| 52 | FUNCTION CODE IS A COMMAND READ HOLDING REGISTERS |
| 01 | FUNCTION EXTENSION |
| XX | CHECK BYTE |
| 7E | STOP CHARACTER |

* suggested (POSSIBLE) use of function extension is to select which register to read such as: 01 = WH, 02 = VARH, 03 = VOLTHOURS, 04 = FREQ, OA = ALL

RESPONSE TO READ HOLDING REGISTERS [52 01]

HEX BYTE

| | |
|---|---|
| 7E | START CHARACTER |
| FF | DESTINATION ADDRESS IS MASTER |
| 01 | SOURCE ADDRESS OF METER RESPONDING |
| 52 | FUNCTION CODE IS A COMMAND READ (ECHO OF CMD RECEIVED) |
| NN | COMMAND EXTENSION IS SEQUENCE NUMBER OF PREVIOUS FREEZE |
| 01 | DATA BYTE 1 |
| 1A | DATA BYTE 2 |
| XX | CHECK BYTE |
| 7E | STOP CHARACTER |

[54 01] ENTER METER TEST MODE

HEX BYTE

| | |
|---|---|
| 7E | START CHARACTER |
| 01 | METER ADDRESS (DESTINATION) |
| FF | MASTER ADDRESS (SOURCE) |
| 54 | FUNCTION CODE |
| 01 | FUNCTION EXTENSION |
| XX | CHECK BYTE |
| 7E | STOP CHARACTER |

RESPONSE TO ENTER METER TEST MODE [54 01]-NONE [57 01] WRITE METER CALIBRATION

| | |
|---|---|
| 7E | START CHARACTER |
| 01 | METER ADDRESS (DESTINATION) |
| FF | MASTER ADDRESS (SOURCE) |
| 57 | FUNCTION CODE WRITE MEMORY |
| 01 | FUNCTION EXTENSION (Identifies which parameters to be written) |
| 09 | DATA BYTE 1 |
| FA | DATA BYTE 2 |
| XX | CHECK BYTE |
| 7E | STOP CHARACTER |

RESPONSE TO WRITE METER CALIBRATION [57 01]-NONE [57 02] WRITE METER ADDRESS (UNIT ID)

HEX BYTE

| | |
|---|---|
| 7E | START CHARACTER |
| 01 | METER ADDRESS (DESTINATION) |
| FF | MASTER ADDRESS (SOURCE) |
| 57 | FUNCTION CODE WRITE MEMORY |
| 09 | FUNCTION EXTENSION (Identifies which parameters to be written) |
| FA | NEW ADDRESS |

| | |
|---|---|
| XX | CHECK BYTE |
| 7E | STOP CHARACTER |

* AA Is a single 8 bit byte represented as 2 hex characters.
Possible values are 1 to 254 decimal (FE HEX). 00 is reserved for a broadcast address and FF (255) is the address of the master.

RESPONSE TO WRITE METER ADDRESS [57 01]-NONE
[57 03] WRITE METER SERIAL NUMBER

HEX BYTE

| | |
|---|---|
| 7E | START CHARACTER |
| 01 | METER ADDRESS (DESTINATION) |
| FF | MASTER ADDRESS (SOURCE) |
| 57 | FUNCTION CODE WRITE MEMORY |
| 03 | FUNCTION EXTENSION (Identifies which parameters to be written) |
| 00 | DATA BYTE 1 |
| 01 | DATA BYTE 2 |
| 08 | DATA BYTE 3 |
| XX | CHECK BYTE |
| 7E | STOP CHARACTER |

Example serial number is 00 01 08 HEX, 264 DECIMAL.

RESPONSE TO WRITE METER SERIAL NUMBER [57 03]-NONE
[57 04] WRITE METER VOLTAGE RATING

HEX BYTE

| | |
|---|---|
| 7E | START CHARACTER |
| 01 | METER ADDRESS (DESTINATION) |
| FF | MASTER ADDRESS (SOURCE) |
| 57 | FUNCTION CODE WRITE MEMORY |
| 04 | FUNCTION EXTENSION (Identifies which parameters to be written) |
| 00 | DATA BYTE 1 |
| 78 | DATA BYTE 2 |
| XX | CHECK BYTE |
| 7E | STOP CHARACTER |

Example voltage rating is 00 78 HEX,120 decimal.

RESPONSE TO WRITE METER VOLTAGE RATING [57 04]-NONE
[57 05] WRITE METER CURRENT RATING

HEX BYTE

| | |
|---|---|
| 7E | START CHARACTER |
| 01 | METER ADDRESS (DESTINATION) |
| FF | MASTER ADDRESS (SOURCE) |
| 57 | FUNCTION CODE WRITE MEMORY |
| 05 | FUNCTION EXTENSION (Identifies which parameters to be written) |
| 00 | DATA BYTE 1 |
| 64 | DATA BYTE 2 |
| XX | CHECK BYTE |
| 7E | STOP CHARACTER |

Example current rating is 00 64 HEX, 100 decimal.

RESPONSE TO WRITE METER CURRENT RATING [57 05]-NONE
[58 01] EXIT METER TEST MODE

HEX BYTE

| | |
|---|---|
| 7E | START CHARACTER |
| 01 | METER ADDRESS (DESTINATION) |
| FF | MASTER ADDRESS (SOURCE) |
| 58 | FUNCTION CODE |
| 01 | FUNCTION EXTENSION |
| XX | CHECK BYTE |
| 7E | STOP CHARACTER |

RESPONSE TO ENTER METER TEST MODE [58 02]-NONE

A check byte is a single byte transmitted at the end of each message for error detection. The check byte is calculated by successive exclusive-OR operations on all bytes of the message beginning after the START characters (7E HEX) and including the last byte prior to the check byte. Inserted data modifiers are not included in the check byte calculation.

Checkbyte calculations are unaffected by the START/STOP character processing. To clarify, on transmission the checkbyte is calculated before START/STOP processing and on reception checkbyte calculation is done after START/STOP processing. So, even if the checkbyte is modified for transmission it will be returned to its original value by the receiver before testing.

Starting with the first byte after the START character, begin by exclusive ORiing with the next byte, then exclusive or that result with the next byte until finished. The example used is a meter CT 10 response to a read meter calibration command.

Check Byte Calculation Example

| HEX | BINARY |
|---|---|
| 7E | START CHARACTER |
| FF | 1111 1111 |
| 01 | 0000 0001 |
| 4D | 0100 1101 |
| 01 | 0000 0001 |
| 09 | 0000 1001 |
| FA | 1111 1010 |
| 41 | 0100 0001 CHECKSUM RESULT |
| 7E | STOP CHARACTER |

Each command is a 2 byte command that has a command portion in the left-hand portion of the command. The extension byte is a breakdown of that command. The meter CTs 10 current and voltage rating are also stored in memory such that the data core 70 can query each meter CT in a chain and read each of their unique identities and ratings to determine whether each is a 100 amp, 150 V meter, etc. This may be helpful in the event that, if someone changes or otherwise tampers with the meter CT 10, data core 70 will be able to determine the change and, if appropriate, report the change.

Accordingly, it is apparent from the foregoing detailed description and illustrative drawings that an integrated meter CT has been invented which satisfies the objectives and achieves the advantages stated throughout this specification. While the invention is susceptible to various modifications and alternative forms, specific embodiments thereof have been shown by way of example in the drawings and have herein been described in detail. It should be understood, however, that it is not intended to limit the invention to the particular forms disclosed, but, on the contrary, the intention is to cover all modifications, equivalents, and alternatives falling within the spirit and scope of the invention as described by the appended claims.

I claim:

1. An electric meter configured to compute an amount of energy consumed by a load powered by a mains voltage, comprising:
   a separable housing;
   a split-core current transformer located within said housing that is configured to inductively sense an amount of current flowing through a conductor coupled to said load, said transformer comprising a metallic core that includes:
   first and second spaced sections, oppositely disposed, each of said first and second sections being surrounded by wound coils; and
   a removable portion comprising third and fourth elongated sections that are configured to form an opposite side of said metallic core, and that are substantially a same length as said first and second sections;

said first and second sections being configured to receive and slideably engage with said third and fourth elongated sections to form a rectangular core having a central opening;

said conductor being located within said central opening such that said wound coils are configured to generate a coil output signal proportional to the amount of current flowing through said conductor; and processing circuitry that is configured to be responsive to said coil output signal from said wound coils and said mains voltage such that said processing circuitry computes the amount of energy being consumed by the load coupled to said conductor and to generate an electrical output signal corresponding to the amount of energy being consumed by said load.

2. The meter of claim 1 wherein said electrical output signal includes a series of pulses having a frequency that is proportional to said amount of energy being consumed.

3. The meter of claim 1 wherein said computed amount of energy being consumed is expressed in watt-hours.

4. The meter of claim 1 wherein said computed amount of energy being consumed is expressed in var-hours.

5. The meter of claim 1 wherein said electrical output signal from said processing circuitry also includes a frequency of said mains voltage.

6. The meter of claim 1 wherein the processing circuitry is located within said housing.

7. The meter of claim 1 further comprising communication circuitry configured to transmit said electrical output signal from said processing circuitry to a central data collector.

8. The meter of claim 7 wherein said communication circuitry comprises a serial data interface.

9. The meter of claim further comprising signal treatment circuitry operatively positioned to receive said coil output signal.

10. The meter of claim 9, wherein said signal treatment circuitry electrically isolates said mains voltage from said processing circuitry.

11. The meter of claim 10 further comprising an optocoupler that is configured to perform said isolation.

* * * * *